US011824179B2

(12) United States Patent
Kaneshima et al.

(10) Patent No.: US 11,824,179 B2
(45) Date of Patent: Nov. 21, 2023

(54) POWER SUPPLY DEVICE

(71) Applicant: HONDA MOTOR CO., LTD., Tokyo (JP)

(72) Inventors: Ryo Kaneshima, Tokyo (JP); Kazuya Nakano, Tokyo (JP); Masaki Takahashi, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 184 days.

(21) Appl. No.: 17/443,705

(22) Filed: Jul. 27, 2021

(65) Prior Publication Data

US 2022/0037718 A1 Feb. 3, 2022

(30) Foreign Application Priority Data

Jul. 29, 2020 (JP) ................................. 2020-128335

(51) Int. Cl.
*H01M 10/6563* (2014.01)
*H01M 10/46* (2006.01)
(Continued)

(52) U.S. Cl.
CPC ....... *H01M 10/6563* (2015.04); *H01M 10/46* (2013.01); *H01M 10/613* (2015.04);
(Continued)

(58) Field of Classification Search
CPC ............. H01M 10/6563; H01M 10/46; H01M 10/613; H01M 10/625; H01M 2220/20;
(Continued)

(56) References Cited

U.S. PATENT DOCUMENTS

| 8,556,017 B2 * | 10/2013 | Kubota | ............... H01M 10/643 |
| | | | 180/68.5 |
| 2011/0011654 A1 * | 1/2011 | Kubota | ................... B60L 50/64 |
| | | | 903/903 |

(Continued)

FOREIGN PATENT DOCUMENTS

| CN | 101997134 A | * | 3/2011 | ............. Y02E 60/10 |
| CN | 106358398 A | * | 1/2017 | ............... H02G 3/08 |

(Continued)

*Primary Examiner* — Kaity V Chandler
(74) *Attorney, Agent, or Firm* — Parautus Law Group, PLLC

(57) ABSTRACT

A power supply device includes: a battery; an electric device; a case accommodating the battery and the electric device; and a cover covering a case opening. The cover is provided with a first exhaust port and a second exhaust port. A first exhaust member having a first exhaust passage through which air discharged from the first exhaust port flows is connected to the first exhaust port. A second exhaust member having a second exhaust passage through which air discharged from the second exhaust port flows is connected to the second exhaust port. The first exhaust port is provided so as to overlap at least a part of the electric device when viewed from an opening direction and has a larger opening area than the second exhaust port. A minimum cross-sectional area of the first exhaust passage is smaller than a minimum cross-sectional area of the second exhaust passage.

5 Claims, 9 Drawing Sheets

(51) Int. Cl.
*H01M 10/613* (2014.01)
*H01M 10/625* (2014.01)
*H05K 5/02* (2006.01)
*H05K 5/03* (2006.01)

(52) U.S. Cl.
CPC ........ *H01M 10/625* (2015.04); *H05K 5/0213* (2013.01); *H05K 5/0217* (2013.01); *H05K 5/03* (2013.01); *H01M 2220/20* (2013.01)

(58) Field of Classification Search
CPC ......... H01M 10/6551; H01M 10/6566; H01M 50/207; H01M 50/249; H01M 50/291; H01M 10/6556; H05K 5/0213; H05K 5/0217; H05K 5/03; H05K 7/20909; Y02E 60/10; Y02T 10/70; B60L 50/66; B60L 50/64
See application file for complete search history.

(56) References Cited

U.S. PATENT DOCUMENTS

| | | | | |
|---|---|---|---|---|
| 2011/0135984 | A1* | 6/2011 | Ekchian | H01M 10/482 200/61.04 |
| 2011/0239681 | A1* | 10/2011 | Ziegler | H05K 7/20745 454/343 |
| 2015/0060168 | A1* | 3/2015 | Janarthanam | B60K 1/04 180/68.1 |
| 2016/0301120 | A1 | 10/2016 | Katsuno et al. | |
| 2017/0267057 | A1 | 9/2017 | Koyama et al. | |
| 2017/0365897 | A1* | 12/2017 | Okada | H01M 10/625 |
| 2019/0291558 | A1* | 9/2019 | Goto | H01M 50/209 |
| 2020/0148136 | A1* | 5/2020 | Takei | B60W 40/08 |
| 2020/0339218 | A1* | 10/2020 | Carmignani | B62J 9/14 |
| 2020/0348090 | A1* | 11/2020 | Riski | F28F 9/001 |
| 2021/0273275 | A1* | 9/2021 | Takahashi | B60K 11/06 |

FOREIGN PATENT DOCUMENTS

| | | | | |
|---|---|---|---|---|
| CN | 107709074 | A * | 2/2018 | ............... B60K 1/04 |
| CN | 106358398 | B * | 3/2019 | ............... H02G 3/08 |
| CN | 210805850 | U * | 6/2020 | ............... Y02E 60/10 |
| JP | 2007335202 | A * | 12/2007 | ............... B60K 1/04 |
| JP | 2008114706 | A * | 5/2008 | ......... B60H 1/00278 |
| JP | 2016-199106 | A | 12/2016 | |
| JP | 2017-165302 | A | 9/2017 | |
| WO | WO-2009098953 | A1 * | 8/2009 | ............... B60K 1/04 |
| WO | WO-2015015659 | A1 * | 2/2015 | ......... B60L 11/1824 |

\* cited by examiner

POWER SUPPLY DEVICE

CROSS-REFERENCE TO RELATED APPLICATIONS

The present application claims the benefit of priority of Japanese Patent Application No. 2020-128335, filed on Jul. 29, 2020, the content of which is incorporated herein by reference.

TECHNICAL FIELD

The present invention relates to a power supply device.

BACKGROUND ART

JP-A-2017-165302 discloses a power supply device which exhausts air introduced to cool a battery from an exhaust duct to a vehicle interior. In the power supply device of JP-A-2017-165302, exhaust ducts are arranged on the left and right and are respectively connected to air outlets formed at two locations on the left and right of a battery cover. In addition, the left and right exhaust ducts respectively discharge the air introduced to cool the battery to left and right sides of the vehicle interior.

JP-A-2016-199106 discloses a power supply device in which a battery and a DC/DC converter are arranged side by side in a vehicle width direction and accommodated in a case. The power supply device of JP-A-2016-199106 can modularize a battery and an electric device such as a DC/DC converter. On the other hand, since the DC/DC converter is accommodated in the case, with a cover attached to the case, it is necessary to insert a cable connected to another electric device located outside the case inside the case and connect the cable to the DC/DC converter. Therefore, in the case of the power supply device of JP-A-2016-199106, it is necessary to provide an opening in the case or cover for performing a work of inserting the cable into the case and connecting the cable to the DC/DC converter.

In this case, by adopting the technology of JP-A-2017-165302 to the power supply device of JP-A-2016-199106, it is conceivable to use one of the two air outlets formed on the left and right sides of the battery cover as an opening for inserting the cable inside the case and connecting the cable to the DC/DC converter.

However, in the power supply device of JP-A-2016-199106, when only one of the two air outlets formed on the left and right sides of the battery cover is set to be large enough to be used as an opening for inserting the cable inside the case and connecting the cable to the DC/DC converter and opening areas of the air outlets formed on the left and right sides of the battery cover are set to be different from each other, amounts of heat of the air discharged from the two air outlets formed on the left and right sides of the battery cover will be different. Then, the amounts of heat of the air discharged from the left and right exhaust ducts to the left and right sides of the vehicle interior will be different, and thus a temperature inside a space (for example, the vehicle interior in JP-A-2017-165302) where the air discharged from the two air outlets formed at the left and right sides of the battery cover is discharged becomes non-uniform. As a result, the comfort of the space where the air discharged from the two air outlets formed at the left and right sides of the battery cover is discharged is reduced.

On the other hand, when the opening areas of the two air outlets formed on the left and right sides of the battery cover are made substantially the same and all of them are set to be large enough to be used as an opening for inserting the cable inside the case and connecting it to the DC/DC converter, a proportion of the opening in the entire cover increases and the strength of the cover decreases. Therefore, it is necessary to make the opening areas of the two air outlets formed at the left and right sides of the battery cover substantially the same while ensuring the strength of the cover. However, in this case, it becomes difficult to insert the cable inside the case and connect the cable to the DC/DC converter and to remove the cable connected to the DC/DC converter from the DC/DC converter. As a result, ease of assembly work and maintenance work is reduced.

As described above, with the technology of the related art, it is difficult to achieve both comfort and ease of assembly work and maintenance work in the power supply device.

SUMMARY

The invention provides a power supply device which has both comfort and ease of assembly work and maintenance work.

According to an aspect of the invention, there is provided a power supply device including: a battery; an electric device arranged side by side with the battery; a case which accommodates the battery and the electric device and has a case opening; and a cover which covers the case opening, where: a cable connected to another electric device arranged outside the case is connected to the electric device; the cover is provided with a first exhaust port and a second exhaust port separated from each other; a first exhaust member having a first exhaust passage through which air discharged from the first exhaust port flows is connected to the first exhaust port; a second exhaust member having a second exhaust passage through which air discharged from the second exhaust port flows is connected to the second exhaust port; the first exhaust port is provided so as to overlap at least a part of the electric device when viewed from an opening direction of the first exhaust port and has a larger opening area than the second exhaust port; and a minimum cross-sectional area of the first exhaust passage is smaller than a minimum cross-sectional area of the second exhaust passage.

According to the invention, the first exhaust port is provided so as to overlap at least a part of the electric device when viewed from the opening direction of the first exhaust port and has a larger opening area than the second exhaust port. Therefore, it is easy to connect the cable to the electric device and remove the cable from the electric device without removing the cover. In addition, since the minimum cross-sectional area of the first exhaust passage is smaller than the minimum cross-sectional area of the second exhaust passage, the difference between the amount of heat of the air discharged from the first exhaust port and the amount of heat of the air discharged from the second exhaust port can be reduced. Therefore, both comfort and ease of assembly work and maintenance work can be achieved.

DESCRIPTION OF EMBODIMENTS

Figure 1:
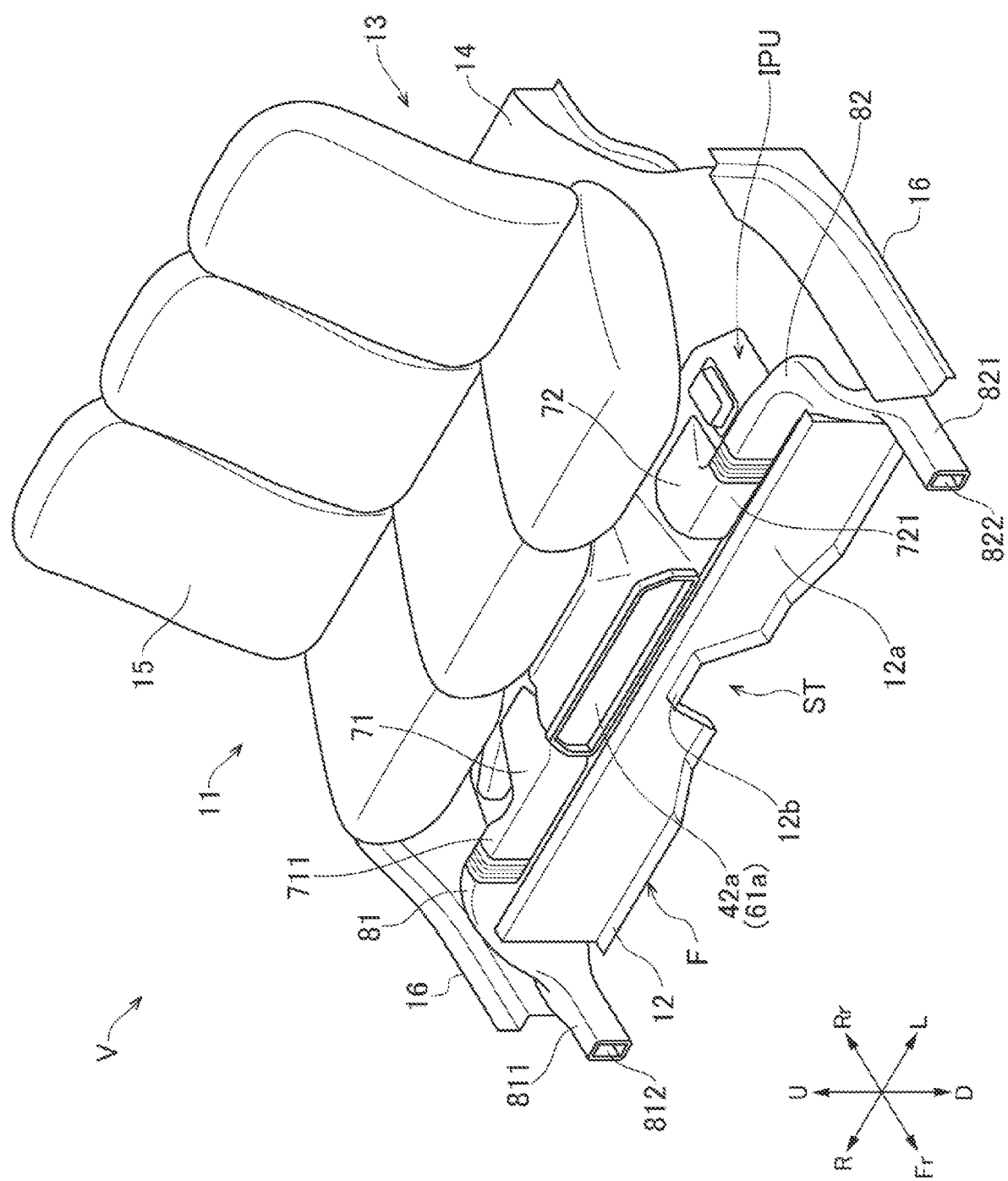
FIG. 1 is a perspective view of a vicinity of a rear seat of a vehicle equipped with a power supply device according to an embodiment of the invention as viewed from diagonally above and forward.

Hereinafter, an embodiment of a power supply device of the invention will be described with reference to the accompanying drawings. In this embodiment, the power supply device is mounted on a vehicle. The drawings shall be viewed in a direction of reference letters. Further, in this specification and the like, in order to simplify and clarify the explanation, each direction of front-rear, left-right, and up-down is described according to a direction seen from a driver of the vehicle. In the drawing, the front of the vehicle is shown as Fr, the rear is shown as Rr, the left is shown as L, the right is shown as R, the upper side is shown as U, and the lower side is shown as D.

Figure 2:
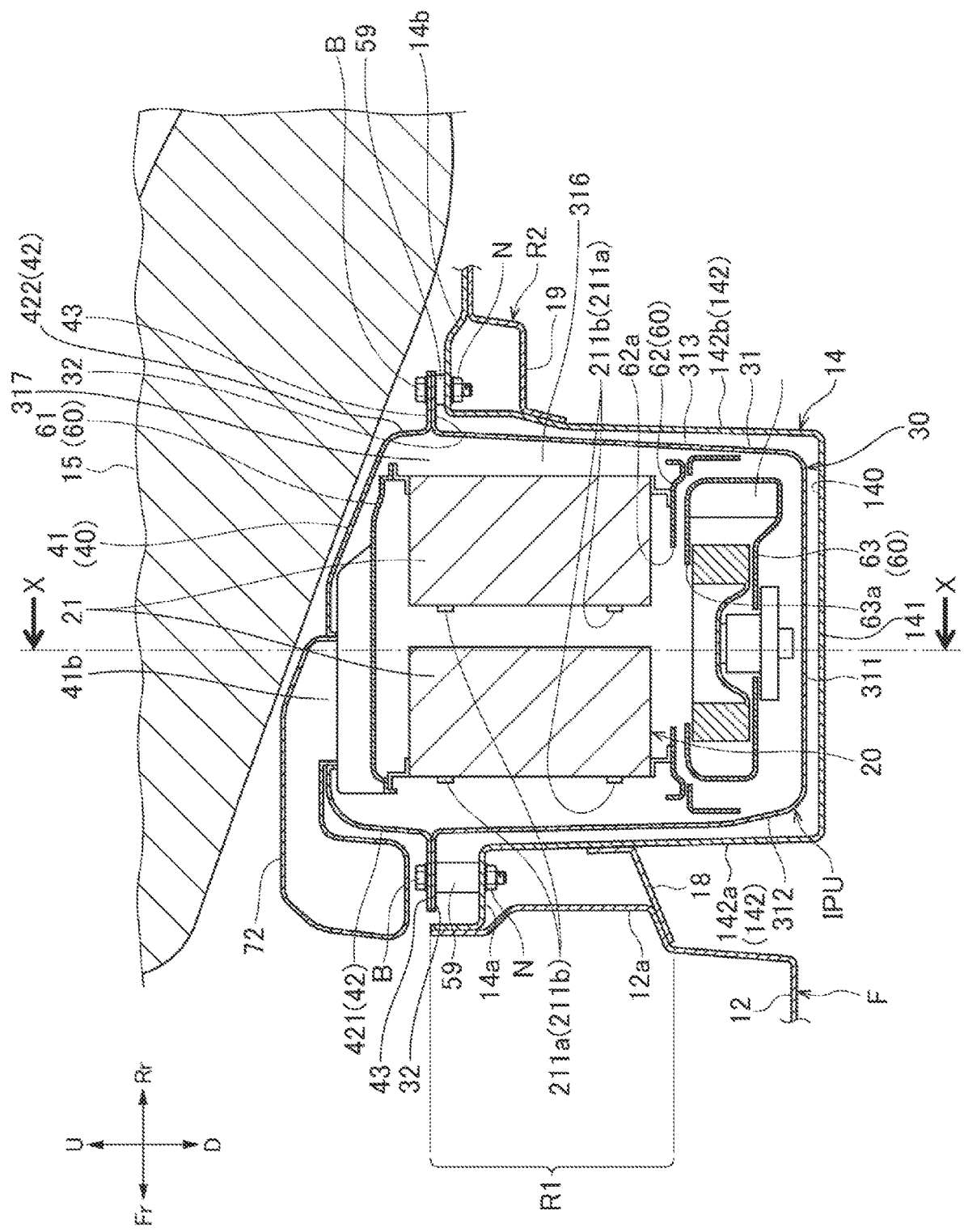
FIG. 2 is a cross-sectional view of a vicinity of a second exhaust duct of the power supply device of FIG. 1 as viewed from a left side.

As illustrated in FIGS. 1 and 2, a vehicle V of the embodiment is, for example, a hybrid vehicle and is equipped with a power supply device IPU accommodating a battery 20. The power supply IPU is arranged in an accommodation recess 140 recessed in a floor panel F and fastened to the floor panel F.

The floor panel F includes a front floor panel 12 which forms a floor portion of a vehicle interior 11 and a rear floor panel 14 which forms a floor portion of a luggage compartment 13. The front floor panel 12 and the rear floor panel 14 are connected below a rear seat 15. Both ends of the floor panel F in a vehicle width direction are connected to a pair of left and right skeleton members 16 extending along a front-rear direction, whereby the floor panel F is fixed to the skeleton member 16.

A kick-up portion 12a which rises upward is formed at a rear end portion of the front floor panel 12. Further, a center tunnel 12b is formed in a central portion of the front floor panel 12 in the vehicle width direction along the front-rear direction. The center tunnel 12b is bent so that the front floor panel 12 is convex upward and a trapezoidal tunnel space ST is formed below. In the tunnel space ST, an exhaust pipe 17 (see FIG. 4) or the like which exhausts exhaust gas from an internal combustion engine (not illustrated) to a rear of the vehicle V is arranged.

The accommodation recess 140 is recessed on a front side of the rear floor panel 14. The power supply device IPU is accommodated in the accommodation recess 140. The accommodation recess 140 is a space surrounded by a rectangular bottom portion 141 which is long in the vehicle width direction and a peripheral wall portion 142 which extends upward from the front, rear, left, and right peripheral edges of the bottom portion 141.

A front cross member R1 and a rear cross member R2 straddling the left and right skeleton members 16 are provided in front of and behind the accommodation recess 140. The front cross member R1 means an area between a polymerized upper end of the kick-up portion 12a of the front floor panel 12 and a front end portion 14a of the rear floor panel 14 and a lower end of a front connecting member 18 extending from a front side surface 142a of the peripheral wall portion 142 of the accommodation recess 140 to a middle portion in a height direction of the kick-up portion 12a. The front cross member R1 has a closed cross section formed by the upper portion of the kick-up portion 12a, the front end portion 14a of the rear floor panel 14, an upper portion of the front side surface 142a of the peripheral wall portion 142 of the accommodation recess 140, and the front connecting member 18. Further, the rear cross member R2 has a closed cross section formed by an upper portion of a rear side surface 142b of the peripheral wall portion 142 of the accommodation recess 140, a rear floor portion 14b extending rearward from an upper end of the rear side surface 142b, and a rear connecting member 19 which connects the rear floor portion 14b separated from the rear side surface 142b and a middle portion in the height direction of the rear side surface 142b.

Figure 3:
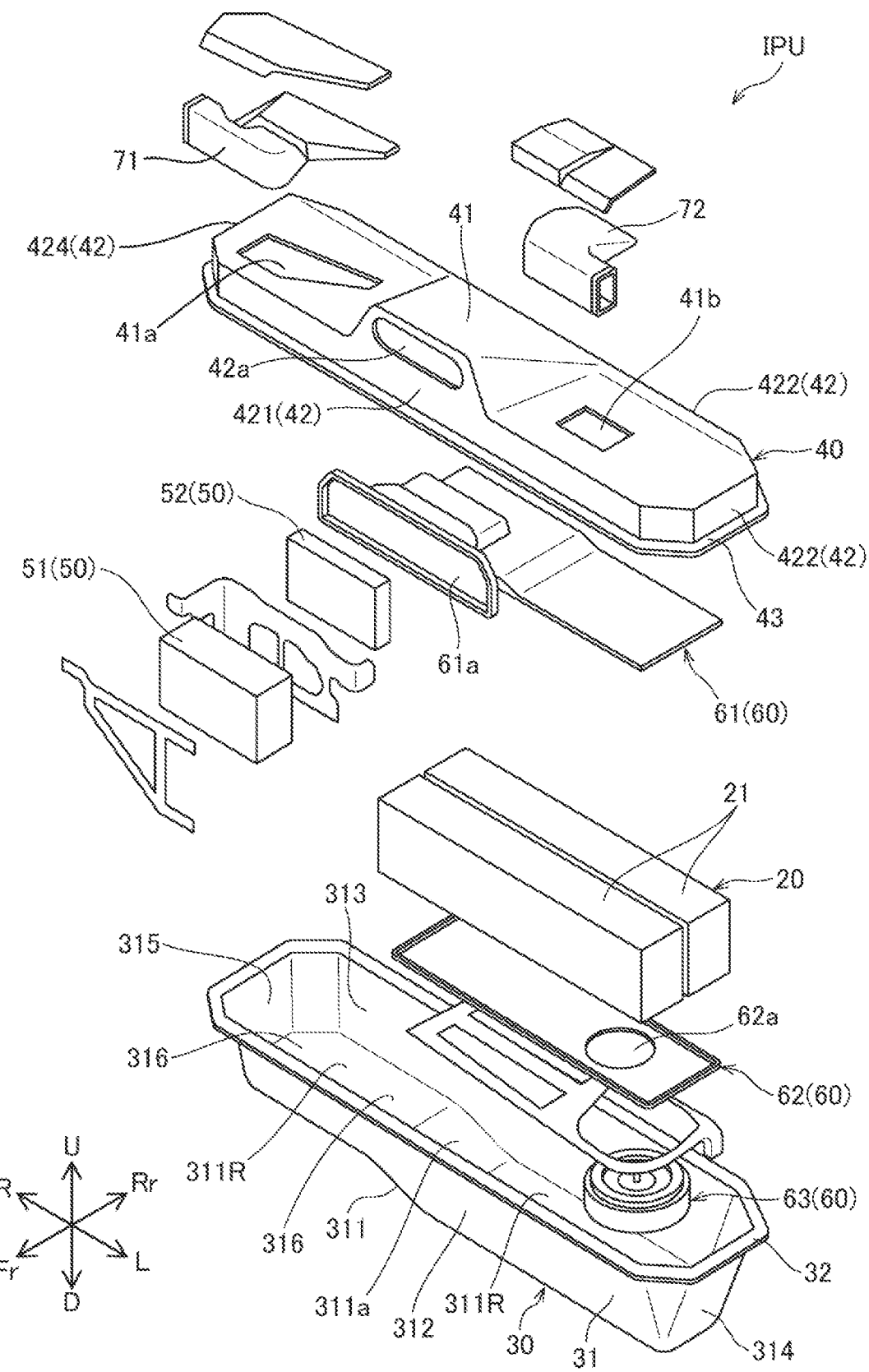
FIG. 3 is an exploded perspective view of the power supply device according to the embodiment of the invention.
Figure 4:
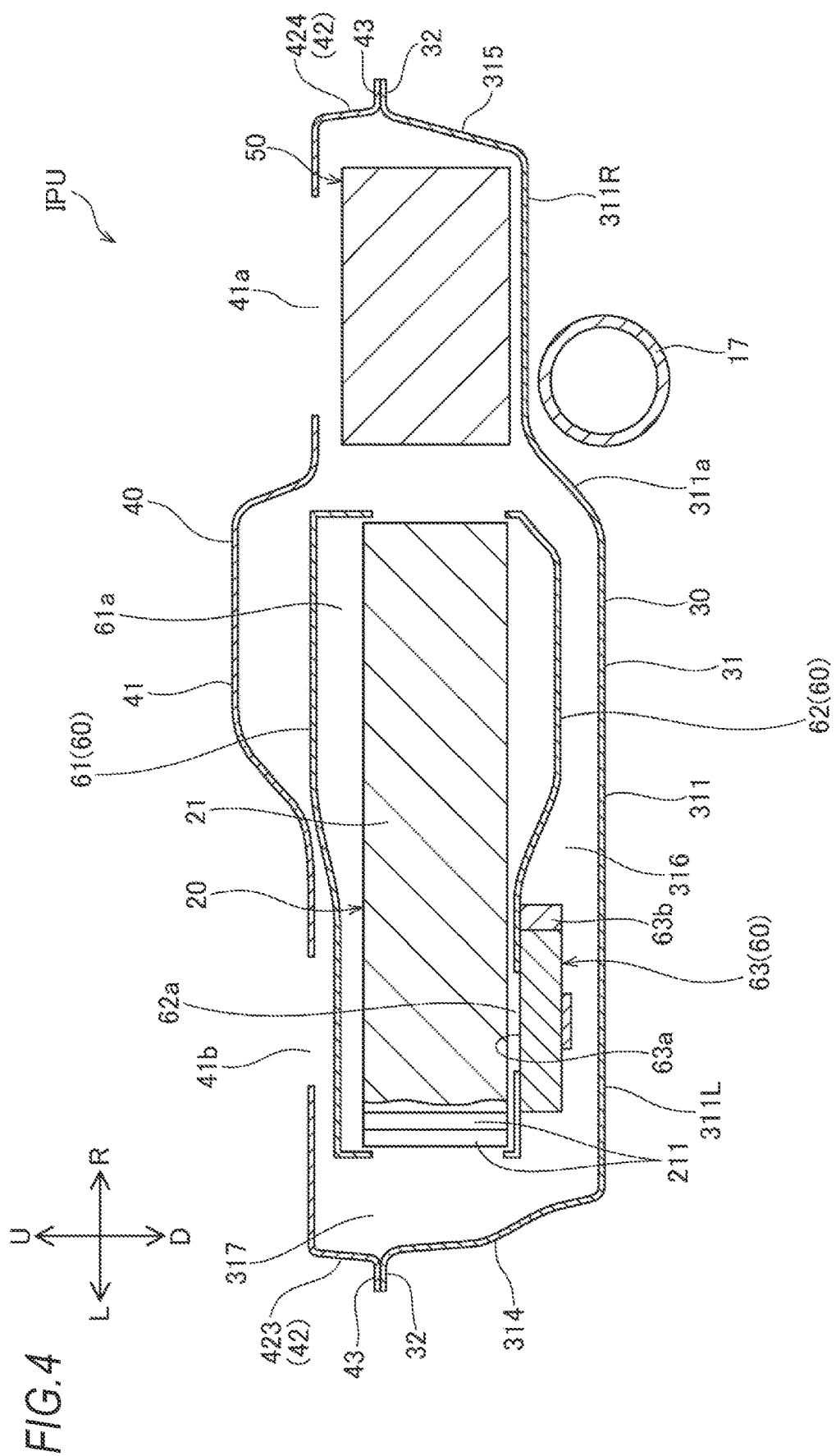
FIG. 4 is a cross-sectional view taken along the line X-X of the power supply device of FIG. 2.

As illustrated in FIGS. 2 to 4, the power supply device IPU includes the battery 20, an electric device 50 arranged side by side with the battery 20, a case 30 which accommodates the battery 20 and the electric device 50 and has a case opening 317, and a cover 40 which covers the case opening 317 of the case 30. A cooling unit 60 is further accommodated in the case 30. During manufacture of the power supply device IPU, the battery 20, the electric device 50 and the cooling unit 60 are accommodated in the case 30 through the case opening 317.

The case 30 is a resin member having a horizontally long substantially rectangular parallelepiped shape that is long in the vehicle width direction and is open at the top. The case 30 has a case body 31 having an upper opening and an annular flange portion 32 extending outward from an upper end portion of the case body 31.

The case body 31 includes a square bottom portion 311 which is long in the vehicle width direction, a front wall portion 312 extending upward so as to rise from a front edge of the bottom portion 311, a rear wall portion 313 extending upward so as to rise from a rear edge of the bottom portion 311, a left wall portion 314 extending upward so as to rise from a left edge of the bottom portion 311, and a right wall portion 315 extending upward so as to rise from a right edge of the bottom portion 311. A peripheral edge of the bottom portion 311 is surrounded by the front wall portion 312, the rear wall portion 313, the left wall portion 314, and the right wall portion 315 extending upward from the front, rear, left, and right peripheral edges. The case body 31 has the case opening 317 surrounded by upper end portions of the front wall portion 312, the rear wall portion 313, the left wall portion 314, and the right wall portion 315. The flange portion 32 extends outward from the peripheral edge of the case opening 317 of the case body 31. The case body 31 is formed with an accommodation portion 316 surrounded by the bottom portion 311, the front wall portion 312, the rear wall portion 313, the left wall portion 314, and the right wall portion 315.

In the accommodation portion 316 of the case body 31, the battery 20 is offset from a center of the accommodation portion 316 in the vehicle width direction (left-right direction) to the left side and the electric devices 50 are arranged side by side on the right side of the battery 20. A right end portion of the battery 20 is located on the right side of the center of the accommodation portion 316 in the vehicle width direction.

The bottom portion 311 of the case body 31 includes a left bottom portion 311L extending in front-rear and left-right directions, a right bottom portion 311R, which extends in the front-rear and left-right directions on the right side and above the left bottom portion 311L, and an inclined portion 311a which connects the left bottom portion 311L and the right bottom portion 311R and inclines gradually upward as it extends toward the right side. In the embodiment, the left bottom portion 311L, the right bottom portion 311R, and the inclined portion 311a all extend in the front-rear direction from the front wall portion 312 to the rear wall portion 313. Further, when viewed from the front, the left bottom portion 311L extends from the lower end of the left wall portion 314 toward the right side so as to extend further to the right side than the center of the bottom portion 311 in the vehicle width direction and the right bottom portion 311R extends from the lower end of the right wall portion 315 toward the left side. Further, the left bottom portion 311L, the right bottom portion 311R, and the inclined portion 311a form a continuous surface and the bottom portion 311 is composed of the left bottom portion 311L, the right bottom portion 311R, and the inclined portion 311a.

The exhaust pipe 17 extending in the front-rear direction is arranged below the bottom portion 311 of the case body 31. The exhaust pipe 17 is located below the right bottom portion 311R and at a position facing the inclined portion 311a. The exhaust pipe 17 is arranged close to the right bottom portion 311R and an upper end of the exhaust pipe 17 is located above the left bottom portion 311L.

The cover 40 is a member which covers the case opening 317 of the case body 31 and closes the case opening 317. The cover 40 includes a ceiling portion 41 formed to have substantially the same shape as an opening shape of the case body 31 when viewed from above, an annular peripheral edge wall 42 extending downward from an outer peripheral edge of the ceiling portion 41, and a flange portion 43 extending outward from a lower end of the peripheral edge wall 42 over the entire periphery. The peripheral edge wall 42 includes a front wall portion 421 extending downward from a front edge of the ceiling portion 41, a rear wall portion 422 extending downward from a rear edge of the ceiling portion 41, a left wall portion 423 extending downward from a left edge of the ceiling portion 41, and a right wall portion 424 extending downward from a right edge of the ceiling portion 41.

In the front wall portion 421 of the peripheral edge wall 42 of the cover 40, an intake port 42a for taking in air of the vehicle interior 11 to the inside of the case 30 is formed. The intake port 42a is formed in a substantially central portion of the cover 40 in the vehicle width direction.

At two locations on the left and right of the ceiling portion 41 of the cover 40, a first exhaust port 41a and a second exhaust port 41b for discharging the air circulating inside the case 30 are provided so as to be separated from each other. The first exhaust port 41a is formed on the right side in the vehicle width direction with respect to the intake port 42a and the second exhaust port 41b is formed on the left side in the vehicle width direction with respect to the intake port 42a. The first exhaust port 41a is provided at a position corresponding to the electric device 50. Specifically, the first exhaust port 41a is provided so as to overlap at least a part of the electric device 50 when viewed from an opening direction (upper in the embodiment) of the first exhaust port 41a. The second exhaust port 41b is provided at a position corresponding to the battery 20. Specifically, the second exhaust port 41b is provided so as to overlap at least a part of the battery 20 when viewed from an opening direction (upper in the embodiment) of the second exhaust port 41b.

The flange portion 43 is overlapped with the flange portion 32 of the case 30 over the entire periphery in a top view. An annular sealing member (not illustrated) is interposed at a portion where the flange portion 32 of the case 30 and the flange portion 43 of the cover 40 overlap. With a plurality of bolts B for inserting the flange portions 32 and 43 from above, the flange portion 32 of the case 30 and the flange portion 43 of the cover 40 are screwed into nuts N previously welded to the underside of the floor panel F via a collar member 59 interposed between the flange portions 32 and 43 and the floor panel F.

In this way, the accommodation portion 316 of the case 30 becomes a space surrounded by the bottom portion 311, the front wall portion 312, the rear wall portion 313, the left wall portion 314, and the right wall portion 315 of the case body 31 and the cover 40.

The battery 20 includes a plurality of battery modules 21. Each battery module 21 is configured by stacking a plurality of battery cells 211 in the vehicle width direction. Each battery module 21 has a horizontally long substantially rectangular parallelepiped shape which is long in the vehicle width direction. The plurality of battery modules 21 are arranged side by side in the front-rear direction of the vehicle V so as to overlap each other when viewed from the front of the vehicle V.

Each battery cell 211 includes a positive electrode terminal 211a and a negative electrode terminal 211b. The positive electrode terminal 211a is connected to the negative electrode terminal 211b of the battery cell 211 adjacent to one side and the negative electrode terminal 211b is connected to the positive electrode terminal 211a of the battery cell 211 adjacent to the other side, whereby the plurality of battery cells 211 are connected in series.

The positive electrode terminal 211a and the negative electrode terminal 211b of the battery cell 211 are provided on a front surface of the battery cell 211 and are provided at positions overlapping the front cross member R1 described above in front view. As a result, the influence of the external input on the positive electrode terminal 211a and the negative electrode terminal 211b is reduced, so that the durability of the battery 20 is improved. For example, when the positive electrode terminal 211a and the negative electrode terminal 211b of the battery cell 211 are provided at positions that do not overlap the front cross member R1 in front view, the positive electrode terminal 211a and the negative electrode terminal 211b need to increase the rigidity of the case 30 in the front-rear direction in preparation for receiving a load from the front. In the embodiment, since the positive electrode terminal 211a and the negative electrode terminal 211b are provided at a position overlapping the front cross member R1 of the vehicle V, the durability of the battery 20 can be increased without increasing the rigidity of the case 30.

The electric device 50 is a device which charges or discharges the battery 20. In the embodiment, the electric device 50 includes a junction board 51 on which wiring components through which the charge and discharge power of the battery 20 flows are mounted and a battery ECU 52 which controls the charge and discharge of the battery 20.

The cooling unit 60 is a unit which takes in the air of the vehicle interior 11 from the intake port 42a of the cover 40 to the accommodation portion 316 of the case 30, cools the battery 20 and the electric device 50 with the taken-in air, and discharges the air after cooling to the outside of the case 30. The cooling unit 60 includes an upper surface covering material 61, a lower surface covering material 62, and a fan 63.

The upper surface covering material 61 is a resin member arranged in the accommodation portion 316 of the case 30 and covering an upper surface of the battery 20. A space through which air can flow is formed between the upper surface covering material 61 and the upper surface of the battery 20. Further, a space through which air can flow is formed between the upper surface covering material 61 and the ceiling portion 41 of the cover 40. Further, the upper surface covering material 61 is provided with an intake portion 61a for taking in air from the intake port 42a of the cover 40 to the upper surface of the battery 20. The intake portion 61a is open forward and takes in the air of the vehicle interior 11 from the intake port 42a of the cover 40. A left end portion of the upper surface covering material 61 is located substantially at the same position as a left end portion of the battery 20 in the vehicle width direction and has a shape which hangs downward. A right end portion of the upper surface covering material 61 is located substantially at the same position as a right end portion of the battery 20 in the vehicle width direction and has a shape which hangs downward. Therefore, the air taken in from the intake port 42a of the cover 40 is suppressed from flowing out from the right end portion of the upper surface covering material 61 to the outside of the space formed between the upper surface covering material 61 and the upper surface of the battery 20.

The lower surface covering material 62 is a resin member which is arranged in the accommodation portion 316 of the case 30 and covers the lower surface of the battery 20. Therefore, the battery 20 is arranged above the lower surface covering material 62. A space through which air can flow is formed between the lower surface covering material 62 and the lower surface of the battery 20. Further, a space through which air can flow is formed between the lower surface covering material 62 and the bottom portion 311 of the case body 31. Further, the lower surface covering material 62 is provided with an exhaust portion 62a which is open downward. The exhaust portion 62a discharges the air above the lower surface covering material 62, which was taken in from the intake port 42a of the cover 40 and cooled the battery 20, into a space formed on a lower side of the lower surface covering material 62, which is the side of the lower surface covering material 62 where the battery 20 is not arranged, specifically, between the lower surface covering material 62 and the bottom portion 311 of the case body 31.

The fan 63 is attached to the lower surface covering material 62 so as to cover the exhaust portion 62a. The fan 63 takes in the air above the lower surface covering material 62, which has been taken in from the intake port 42a of the cover 40 and cooled the battery 20, from the exhaust portion 62a of the lower surface covering material 62. Then, the fan 63 discharges the air into the space formed on a lower side of the lower surface covering material 62, which is the side of the lower surface covering material 62 where the battery 20 is not arranged, specifically, between the lower surface covering material 62 and the bottom portion 311 of the case body 31. In this embodiment, the fan 63 is a sirocco fan and is attached to the lower surface of the lower surface covering material 62. An intake port 63a is formed on an upper surface portion of the fan 63 and an exhaust port 63b is formed on an outer peripheral portion of the fan 63. The exhaust port 63b is formed on a right side of the outer peripheral portion, in other words, on the side where the electric device 50 is arranged. The fan 63 takes in the air above the lower surface covering material 62 which cooled the battery 20 from the exhaust portion 62a into the intake port 63a, and then the fan 63 discharges the air from the exhaust port 63b to the right, in other words, toward a direction in which the electric device 50 is arranged, into a space formed between the lower surface covering material 62 and the bottom portion 311 of the case 30.

Therefore, since the drive of the fan 63 forcibly takes in the air outside the case 30 from the intake portion 61a of the upper surface covering material 61, the battery 20 is supplied with cold air outside the case 30 taken in from the intake portion 61a. On the other hand, since the air obtained by cooling the battery 20 and raising the temperature is forcibly discharged into the space formed between the lower surface covering material 62 and the bottom portion 311 of the case body 31 by the exhaust portion 62a and the fan 63, the air obtained by cooling the battery 20 and raising the temperature is not directly supplied to the battery 20. As a result, the battery 20 is cooled by the low-temperature air taken in from the outside of the case 30. As a result, the battery 20 can be appropriately cooled without providing a heat exchanger.

The intake portion 61a is arranged on one end side of the battery 20 in the vehicle width direction and the exhaust portion 62a and the fan 63 are arranged on the other end side of the battery 20 in the vehicle width direction. In the embodiment, the intake portion 61a is arranged on the right end side of the battery 20 and the exhaust portion 62a and the fan 63 are arranged on the left end side of the battery 20.

In this way, the air taken in from the intake portion 61a flows from the intake portion 61a to the exhaust portion 62a and the fan 63 by the fan 63, so the air flows from an upper end to a lower end of the battery 20 and from a right end side to a left end side in the vehicle width direction of the battery 20. As a result, the low-temperature air outside the case 30 taken in from the intake portion 61a can be flowed through the entire battery 20, so that the entire battery 20 can be cooled uniformly.

Further, the fan 63 takes in the air above the lower surface covering material 62 which cooled the battery 20 from the exhaust portion 62a to the intake port 63a and discharges the air from the exhaust port 63b to the right, in other words, toward the direction in which the electric device 50 is arranged, so that the air which cooled the battery 20 can be supplied to the electric device 50. As a result, both the battery 20 and the electric device 50 can be cooled by the air taken in from the intake portion 61a.

In general, the electric device 50 such as the junction board 51 and the battery ECU 52 has a lower required cooling capacity than the battery 20, so that even when the electric device 50 is cooled by the air obtained by cooling the battery 20, the electric device 50 can be sufficiently cooled. Therefore, both the battery 20 and the electric device 50 can be efficiently and sufficiently cooled by the air taken in from the intake portion 61a.

Further, since the electric device 50 is arranged side by side on the right side of the battery 20 and the fan 63 is arranged on the left end side of the battery 20, the air discharged from the exhaust port 63b of the fan 63 flows in the vehicle width direction from the left end portion to the right end portion of the space formed between the lower surface covering material 62 and the bottom portion 311 of the case 30 and is supplied to the electric device 50 from the right end portion of the space. Therefore, the air discharged from the fan 63 after cooling the battery 20 and raising the temperature is cooled while flowing in the vehicle width direction from the left end portion to the right end portion in the space formed between the lower surface covering material 62 and the bottom portion 311 of the case 30. As a result, the cooled air can be supplied to the electric device 50, so that the electric device 50 can be cooled more effectively.

Further, the bottom portion 311 of the case 30 has the inclined portion 311*a* described above and the inclined portion 311*a* is inclined gradually upward as it extends from the left side where the fan 63 is arranged to the right side where the electric device 50 is arranged in the vehicle width direction, so that the air discharged from the fan 63 into the space formed between the lower surface covering material 62 and the bottom portion 311 of the case 30 is guided to the upper right along the inclined portion 311*a*. As a result, the air discharged from the fan 63 after cooling battery 20 can be more efficiently supplied to the electric device 50.

Further, high-temperature exhaust gas flows from an internal combustion engine through the exhaust pipe 17 located below the right bottom portion 311R of the case body 31 and at a position facing the inclined portion 311*a* of the case body 31. In the embodiment, the air discharged from the fan 63 flows in the space between the left bottom portion 311L and the inclined portion 311*a* of the case body 31 and the lower surface covering material 62, so it is possible to prevent the battery 20 from receiving the heat of the high-temperature exhaust gas flowing through the exhaust pipe 17.

The air supplied to the electric device 50 from a left end portion of the space formed between the lower surface covering material 62 and the bottom portion 311 of the case 30 cools the electric device 50, and then the air is discharged from the first exhaust port 41*a* of the cover 40 to the outside of the accommodation portion 316 of the case 30. In this case, the right end portion of the upper surface covering material 61 has a shape which hangs downward and the air which cooled the electric device 50 is suppressed from flowing into a space formed between the upper surface covering material 61 and the upper surface of the battery 20.

After cooling the electric device 50, a part of the air supplied to the electric device 50 passes through a space formed between the upper surface covering material 61 and the ceiling portion 41 of the cover 40 and is discharged from the second exhaust port 41*b* of the cover 40 to the outside of the accommodation portion 316 of the case 30. Further, a part of the air discharged from the exhaust port 63*b* of the fan 63 flows to a space formed between the upper surface covering material 61 and the ceiling portion 41 of the cover 40 via the space formed between the lower surface covering material 62 and the bottom portion 311 of the case 30, a space formed between the left end portion of the battery 20 and the left wall portion 314 of the case body 31, a space formed between a front end portion of the battery 20 and the front wall portion 312 of the case body 31, a space formed between a rear end portion of the battery 20 and the rear wall portion 313 of the case body 31, a space formed between adjacent batteries 20, and the like, and then it is discharged to the outside of the accommodation portion 316 of the case 30 from the second exhaust port 41*b* of the cover 40. In this case, the left end portion of the upper surface covering material 61 is located substantially at the same position as the left end portion of the battery 20 in the vehicle width direction and has a shape which hangs downward. Therefore, the air which cooled the battery 20 is suppressed from flowing into the space formed between the upper surface covering material 61 and the upper surface of the battery 20.

As described above, the air discharged from the first exhaust port 41*a* of the cover 40 mainly cools both the battery 20 and the electric device 50 and also receives the heat of the high-temperature exhaust gas flowing through the exhaust pipe 17. On the other hand, the air discharged from the second exhaust port 41*b* of the cover 40 is the air which, mainly, after cooling the battery 20, flows into the space formed between the upper surface covering material 61 and the ceiling portion 41 of the cover 40 via the space formed between the lower surface covering material 62 and the bottom portion 311 of the case 30, the space formed between the left end portion of the battery 20 and the left wall portion 314 of the case body 31, the space formed between the front end portion of the battery 20 and the front wall portion 312 of the case body 31, the space formed between the rear end portion of the battery 20 and the rear wall portion 313 of the case body 31, the space formed between adjacent batteries 20, and the like. Therefore, the air discharged from the first exhaust port 41*a* of the cover 40 is hotter than the air discharged from the second exhaust port 41*b* of the cover 40.

The first exhaust port 41*a* is formed on the right side in the vehicle width direction with respect to the intake port 42*a* and the second exhaust port 41*b* is formed on the left side in the vehicle width direction with respect to the intake port 42*a*. That is, in a longitudinal direction of the case 30, the first exhaust port 41*a* is formed on one side of the intake port 42*a* and the second exhaust port 41*b* is formed on the other side of the intake port 42*a*. When both the first exhaust port 41*a* and the second exhaust port 41*b* are formed on either one side or the other side in the longitudinal direction of the case 30, the air on a side where the first exhaust port 41*a* and the second exhaust port 41*b* are not provided in the longitudinal direction of the case 30 is likely to stay without being discharged to the outside of the case 30, so that the cooling efficiency of the battery 20 and the electric device 50 is lowered. In the embodiment, in the longitudinal direction of the case 30, the first exhaust port 41*a* is formed on one side of the intake port 42*a* and the second exhaust port 41*b* is formed on the other side of the intake port 42*a*. Therefore, the air staying in the accommodation portion 316 of the case 30 can be reduced, and thus the battery 20 and the electric device 50 can be cooled more efficiently.

As illustrated in FIGS. 1 to 5, a first exhaust duct 71 is connected to the first exhaust port 41*a* of the cover 40. The first exhaust duct 71 is formed with a first exhaust passage 711 through which the air discharged from the first exhaust port 41*a* of the cover 40 flows.

The first exhaust duct 71 includes a cover portion 71*a* which covers the first exhaust port 41*a* of the cover 40 from above, a front extension portion 71*b* extending forward from a front end of the cover portion 71*a* toward the front wall portion 421 of the cover 40, and a right extension portion 71*c* extending from a front end of the front extension portion 71*b* toward a right side in the vehicle width direction along the front wall portion 421 of the cover 40.

The first exhaust passage 711 includes an intake portion 711*a* which is formed by a space surrounded by the cover portion 71*a* and the ceiling portion 41 of the cover 40 and takes in the air discharged from the first exhaust port 41*a* of the cover 40, a front extension path 711*b* which is formed in the front extension portion 71*b* of the first exhaust duct 71 and extends in the front-rear direction in a state where a rear end communicates with a front end side of the intake portion 711*a*, and a right extension path 711*c* which is formed in the right extension portion 71*c* of the first exhaust duct 71 and extends in the vehicle width direction in a state where a left end communicates with a front end of the front extension path 711*b*. The right end of the right extension path 711*c* opens to the right in the vehicle width direction.

A first extension duct 81 is connected to the first exhaust duct 71. The first extension duct 81 has a first extension passage 811 in which one end side communicates with a right open end of the right extension path 711c of the first exhaust passage 711 and the other end side is an opening 812 which opens toward the vehicle interior 11. The opening 812 of the first extension duct 81 is provided at a lower right end portion of the vehicle interior 11 in the vehicle width direction.

As a result, the air discharged from the first exhaust port 41a of the cover 40 is taken into the intake portion 711a of the first exhaust passage 711 and flows from the front end of the intake portion 711a through the front extension path 711b and the right extension path 711c in this order. Then, the air passes from the right end of the right extension path 711c, through the first extension passage 811 of the first extension duct 81 and is discharged from the opening 812 to the lower right end portion of the vehicle interior 11.

A second exhaust duct 72 is connected to the second exhaust port 41b of the cover 40. The second exhaust duct 72 is formed with a second exhaust passage 721 through which the air discharged from the second exhaust port 41b of the cover 40 flows.

The second exhaust duct 72 includes a cover portion 72a which covers the second exhaust port 41b of the cover 40 from above, a front extension portion 72b extending forward from a front end of the cover portion 72a toward the front wall portion 421 of the cover 40, and a left extension portion 72c extending from a front end of the front extension portion 72b toward a left side in the vehicle width direction along the front wall portion 421 of the cover 40.

The second exhaust passage 721 includes an intake portion 721a which is formed by a space surrounded by the cover portion 72a and the ceiling portion 41 of the cover 40 and takes in the air discharged from the second exhaust port 41b of the cover 40, a front extension path 721b which is formed in the front extension portion 72b of the second exhaust duct 72 and extends in the front-rear direction in a state where a rear end communicates with a front end side of the intake portion 721a, and a left extension path 721c which is formed in the left extension portion 72c of the second exhaust duct 72 and extends in the vehicle width direction in a state where a right end communicates with a front end of the front extension path 721b. A left end of the left extension path 721c opens to the left in the vehicle width direction.

A second extension duct 82 is connected to the second exhaust duct 72. The second extension duct 82 has a second extension passage 821 in which one end side communicates with an left open end of the left extension path 721c of the second exhaust passage 721 and the other end side is an opening 822 which opens toward the vehicle interior 11. The opening 822 of the second extension duct 82 is provided at a lower left end portion of the vehicle interior 11 in the vehicle width direction.

As a result, the air discharged from the second exhaust port 41b of the cover 40 is taken into the intake portion 721a of the second exhaust passage 721 and flows from the front end of the intake portion 721a through the front extension path 721b and the left extension path 721c in this order. Then, the air passes from the right end of the left extension path 721c, through the second extension passage 821 of the second extension duct 82, and is discharged from the opening 822 to the lower left end portion of the vehicle interior 11.

Figure 6:
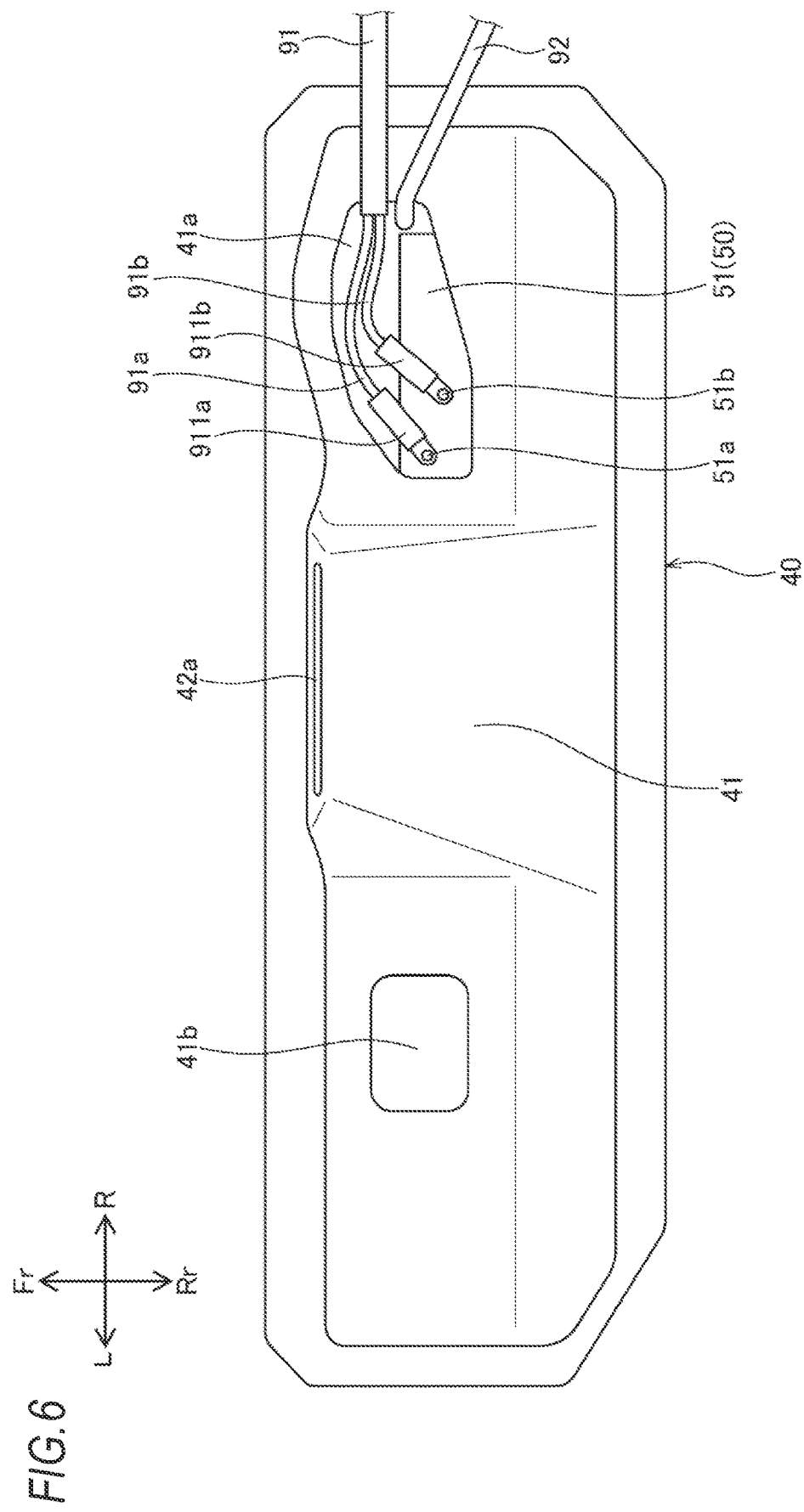
FIG. 6 is a top view of the power supply device of FIG. 1 as viewed with a first exhaust duct and the second exhaust duct removed.
Figure 7:
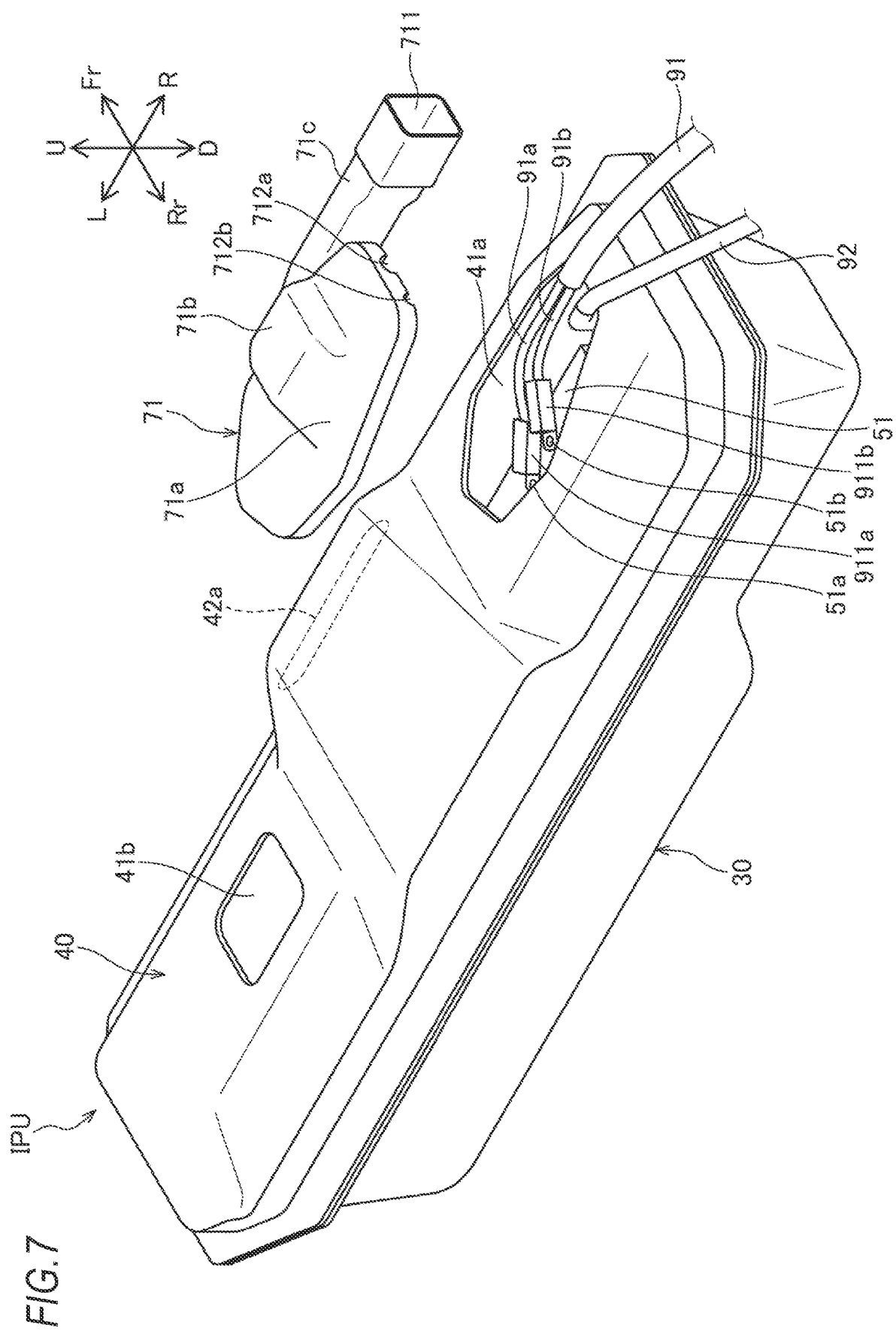
FIG. 7 is an enlarged view of a vicinity of a cover and the first exhaust duct of FIG. 3.

As illustrated in FIGS. 6 and 7, an electric device which is arranged outside the case 30 and through which high-voltage power flows, for example, a DC cable 91 connected to an electric junction box (junction box), and an electric device which is arranged outside the case 30 and through which low-voltage power flows, for example, a harness cable 92 connected to an MG-ECU which controls the drive of the vehicle V, are connected to the electric device 50.

At a lower end of a right side surface of the cover portion 71a of the first exhaust duct 71, a first recess 712a and a second recess 712b recessed upward are formed side by side in the front-rear direction. In the embodiment, the first recess 712a and the second recess 712b are formed side by side in the front-rear direction on the right side surface of the cover portion 71a so that the first recess 712a is in the front and the second recess 712b is in the rear. The first recess 712a and the second recess 712b communicate the outside of the first exhaust duct 71 with the intake portion 711a inside the cover portion 71a of the first exhaust duct 71.

The DC cable 91 is inserted into the accommodation portion 316 of the case 30 from the right side of the first exhaust duct 71 outside the case 30 through the first recess 712a, the intake portion 711a inside the cover portion 71a, and the first exhaust port 41a of the cover 40 and is connected to the electric device 50. The harness cable 92 is inserted into the accommodation portion 316 of the case 30 from the right side of the first exhaust duct 71 outside the case 30 through the second recess 712b, the intake portion 711a inside the cover portion 71a, and the first exhaust port 41a of the cover 40 and is connected to the electric device 50. In the embodiment, the DC cable 91 is connected to the junction board 51 and the harness cable 92 is connected to the battery ECU 52.

As a result, since it is not necessary to separately provide an opening for inserting the DC cable 91 and the harness cable 92 into the accommodation portion 316 of the case 30 from the outside of the case 30 in the case 30 and the cover 40, the structure of the case 30 and the cover 40 of the power supply device IPU can be simplified.

Further, since the DC cable 91 and the harness cable 92 are inserted into the accommodation portion 316 of the case 30 from the right side of the first exhaust duct 71 outside the case 30 through the intake portion 711a inside the cover portion 71a and first exhaust port 41a of the cover 40 and are connected to the electric device 50, the DC cable 91 and the harness cable 92 can be arranged so as to be inserted into the accommodation portion 316 of the case 30 from a right side surface of the first exhaust port 41a of the cover 40. As a result, it is possible to prevent the DC cable 91 and the harness cable 92 from obstructing the flow of air from the front end of the intake portion 711a of the first exhaust passage 711 to the front extension path 711b.

The first exhaust port 41a of the cover 40 is provided so as to overlap at least a part of the electric device 50 when viewed from the opening direction (upper in the embodiment) of the first exhaust port 41a and the first exhaust port 41a of the cover 40 has a larger opening area than the second exhaust port 41b of the cover 40.

As a result, the electric device 50 can be easily accessed from the first exhaust port 41a without removing the cover 40. Therefore, the work of connecting the DC cable 91 and the harness cable 92 to the electric device 50 and the work of removing the DC cable 91 and the harness cable 92 from the electric device 50 can be easily performed without removing the cover 40.

A high-voltage direct current flows through the DC cable 91. The DC cable 91 has a positive power line 91a and a negative power line 91b. A positive terminal portion 911a is provided at a tip of the positive power line 91a. A negative terminal portion 911b is provided at a tip of the negative power line 91b. A first fastening portion 51a to which the positive terminal portion 911a of the positive power line 91a is fastened and a second fastening portion 51b to which the negative terminal portion 911b of the negative power line 91b is fastened are provided on the junction board 51. By fastening the positive terminal portion 911a of the positive power line 91a to the first fastening portion 51a of the junction board 51 and the negative terminal portion 911b of the negative power line 91b to the second fastening portion 51b of the junction board 51, the junction board 51 is electrically connected via the DC cable 91 to the electric device which is arranged outside the case 30 and through which high-voltage power flows. The first fastening portion 51a and the second fastening portion 51b of the junction board 51 are provided at positions inside the first exhaust port 41a when viewed from the opening direction (upper in the present embodiment) of the first exhaust port 41a.

As a result, it is possible to easily access the first fastening portion 51a and the second fastening portion 51b of the junction board 51 through the first exhaust port 41a of the cover 40. Therefore, it becomes easier to connect the DC cable 91 to the electric device 50 and to remove the DC cable 91 from the electric device 50 without removing the cover 40.

Figure 5:
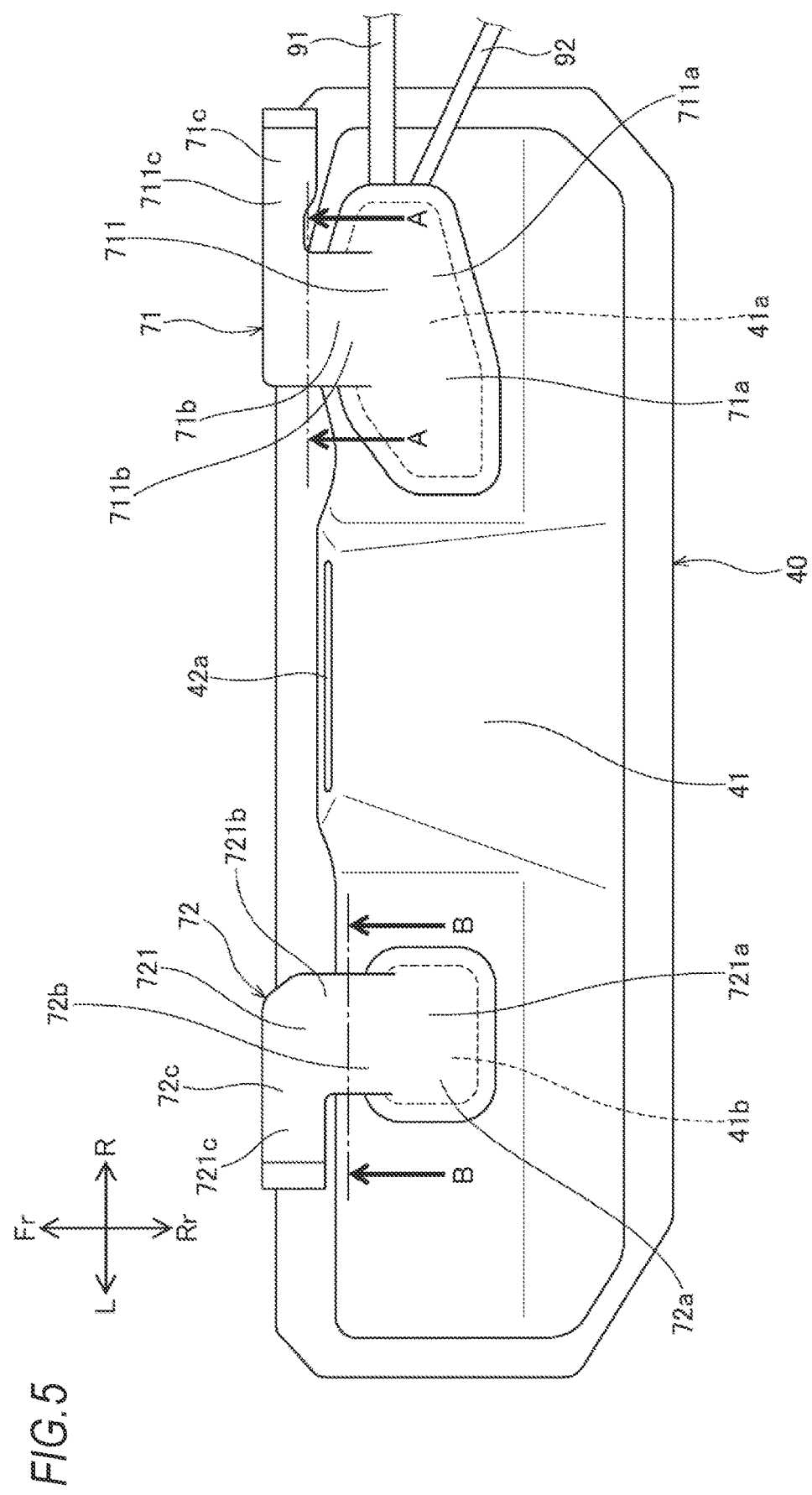
FIG. 5 is a top view of the power supply device of FIG. 1.
Figure 8:
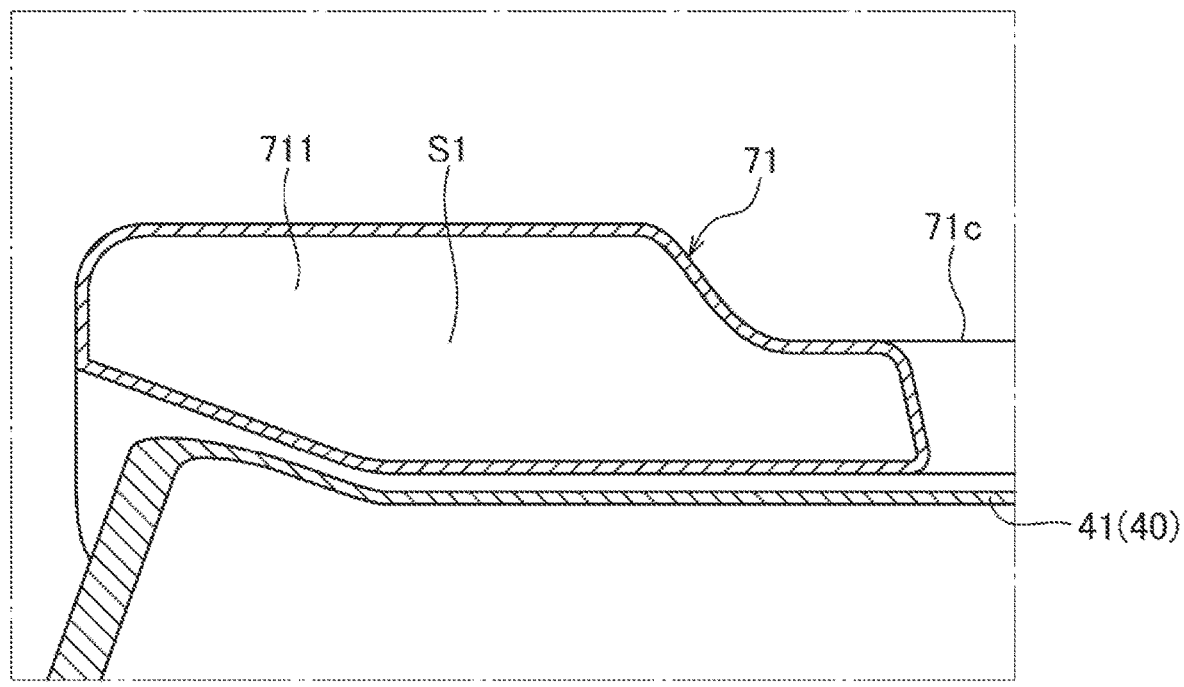
FIG. 8 is a cross-sectional view taken along the line A-A of FIG. 5 illustrating a minimum cross-sectional area portion of a first exhaust passage.
Figure 9:
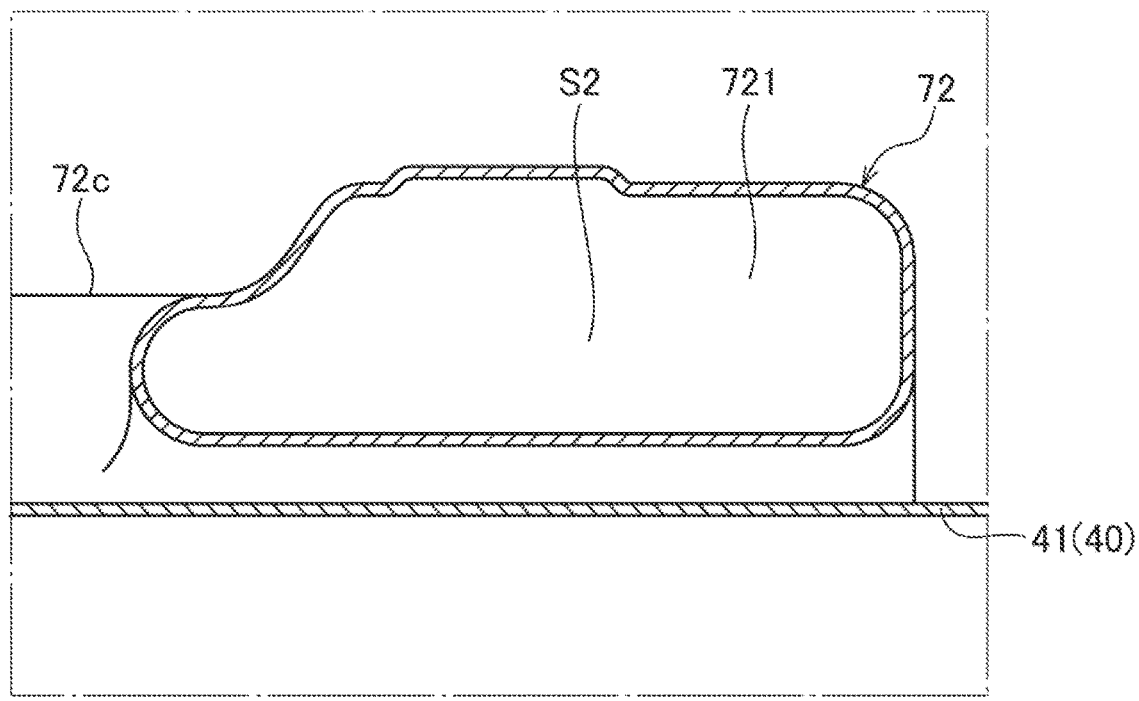
FIG. 9 is a cross-sectional view taken along the line B-B of FIG. 5 illustrating a minimum cross-sectional area portion of a second exhaust passage.

As illustrated in FIGS. 5, 8 and 9, a minimum cross-sectional area S1 of the first exhaust passage 711 formed in the first exhaust duct 71 is smaller than a minimum cross-sectional area S2 of the second exhaust passage 721 formed in the second exhaust duct 72.

Therefore, a flow rate of air passing through the first exhaust passage 711 is smaller than a flow rate of air passing through the second exhaust passage 721. That is, the flow rate of the air discharged from the first exhaust port 41a of the cover 40 is smaller than the flow rate of the air discharged from the second exhaust port 41b of the cover 40.

In this case, as described above, the air discharged from the second exhaust port 41b of the cover 40 is mainly the air which cooled both the battery 20 and the electric device 50 and received the heat of the high-temperature exhaust gas flowing through the exhaust pipe 17. Therefore, the air discharged from the second exhaust port 41b of the cover 40 is hotter than the air discharged from the second exhaust port 41b of the cover 40.

In the embodiment, the flow rate of air passing through the first exhaust passage 711 is smaller than the flow rate of air passing through the second exhaust passage 721. Therefore, in the case of the hot air which cooled both the battery 20 and the electric device 50 and received the heat of the hot exhaust gas flowing through the exhaust pipe 17, the amount of air discharged from the second exhaust port 41b without being discharged from the first exhaust port 41a of the cover 40 increases. As a result, a difference between the temperature of the air discharged from the first exhaust port 41a of the cover 40 and the temperature of the air discharged from the second exhaust port 41b of the cover 40 becomes small.

Further, the air discharged from the first exhaust port 41a of the cover 40 has a higher temperature and a smaller flow rate than the air discharged from the second exhaust port 41b of the cover 40. Therefore, a difference between the amount of heat of the air discharged from the first exhaust port 41a of the cover 40 and the amount of heat of the air discharged from the second exhaust port 41b of the cover 40 becomes small.

Therefore, in the embodiment, the difference between the temperature of the air discharged from the first exhaust port 41a of the cover 40 and the temperature of the air discharged from the second exhaust port 41b of the cover 40 becomes small and the difference between the amount of heat of the air discharged from the first exhaust port 41a of the cover 40 and discharged from the opening 812 of the first extension duct 81 to a lower right end portion of the vehicle interior 11 and the amount of heat of the air discharged from the second exhaust port 41b of the cover 40 and discharged from the opening 822 of the second extension duct 82 to a lower left end portion of the vehicle interior 11 becomes small. Therefore, it is possible to prevent the room temperature of the vehicle interior 11 from becoming non-uniform. As a result, the discomfort to an occupant of the vehicle V can be reduced and the comfort is improved.

As described above, in the power supply device IPU of the embodiment, it is easy to connect the DC cable 91 and the harness cable 92 to the electric device 50 and to remove the DC cable 91 and the harness cable 92 from the electric device 50 without removing the cover 40. Further, the difference between the amount of heat discharged from the first exhaust port 41a of the cover 40 and the amount of heat discharged from the second exhaust port 41b of the cover 40 can be reduced, and thus the room temperature of the vehicle interior 11 can be suppressed from becoming non-uniform. Therefore, the power supply device IPU of the invention can achieve both comfort and ease of assembly work and maintenance work.

Although one embodiment of the invention is described above with reference to the accompanying drawings, it goes without saying that the invention is not limited to such an embodiment. It is clear that a person skilled in the art can come up with various amended examples or modification examples within the scope of the claims and it is understood that they also naturally belong to the technical scope of the invention. In addition, each component in the above embodiment may be arbitrarily combined as long as the gist of the invention is not deviated.

At least the following matters are described in this specification. In parentheses, the corresponding components and the like in the above-described embodiment are shown as an example, but the invention is not limited thereto.

(1) A power supply device (power supply device IPU) including:
  a battery (battery 20);
  an electric device (electric device 50) arranged side by side with the battery;
  a case (case 30) which accommodates the battery and the electric device and has a case opening (case opening 317); and
  a cover (cover 40) which covers the case opening, where
  a cable (DC cable 91) connected to another electric device arranged outside the case is connected to the electric device,
  the cover is provided with a first exhaust port (first exhaust port 41a) and a second exhaust port (second exhaust port 41b) separated from each other,
  a first exhaust member (first exhaust duct 71) having a first exhaust passage (first exhaust passage 711) through which air discharged from the first exhaust port flows is connected to the first exhaust port,
  a second exhaust member (second exhaust duct 72) having a second exhaust passage (second exhaust passage 721) through which air discharged from the second exhaust port flows is connected to the second exhaust port,
  the first exhaust port is provided so as to overlap at least a part of the electric device when viewed from an opening direction of the first exhaust port and has a larger opening area than the second exhaust port, and a minimum cross-sectional area (minimum cross-sectional area S1) of the first exhaust passage is smaller than a minimum cross-sectional area (minimum cross-sectional area S2) of the second exhaust passage.

According to (1), the first exhaust port is provided so as to overlap at least a part of the electric device when viewed from the opening direction of the first exhaust port and has a larger opening area than the second exhaust port. Therefore, it is easy to connect the cable to the electric device and remove the cable from the electric device without removing the cover. In addition, since the minimum cross-sectional area of the first exhaust passage is smaller than the minimum cross-sectional area of the second exhaust passage, the difference between the temperature of the air discharged from the first exhaust port and the temperature of the air discharged from the second exhaust port can be reduced, and further the difference between the amount of heat discharged from the first exhaust port and the amount of heat discharged from the second exhaust port can be reduced. Therefore, both comfort and ease of assembly work and maintenance work can be achieved.

(2) The power supply device according to (1), where
the cable is inserted into the case through the first exhaust port and connected to the electric device.

According to (2), since the cable is inserted into the case through the first exhaust port and connected to the electric device, there is no need to provide a separate opening in the case or cover for inserting cables from the outside of the case to the inside of the case. This simplifies the structure of the case and cover of the power supply device.

(3) The power supply device according to (1) or (2), where
the electric device has a fastening portion (first fastening portion 51a and second fastening portion 51b) to which a terminal portion (positive terminal portion 911a and negative terminal portion 911b) of the cable is fastened, and
the fastening portion is provided at a position inside the first exhaust port when viewed from the opening direction of the first exhaust port.

According to (3), since the fastening portion of the electric device is provided at a position inside the first exhaust port when viewed from the opening direction of the first exhaust port, it is possible to easily access the fastening portion of the electric device from the first exhaust port. This makes it easier to connect the cable to the electric device and to remove the cable from the electric device without removing the cover.

(4) The power supply device according to any one of (1) to (3), where
the cover is provided with an intake port (intake port 42a) for taking in air inside the case, and
the first exhaust port is formed on one side (right side) of the intake port in a longitudinal direction (vehicle width direction) of the case and the second exhaust port is formed on the other side (left side) of the intake port.

According to (4), in the longitudinal direction of the case, the first exhaust port is formed on one side of the intake port and the second exhaust port is formed on the other side of the intake port. Therefore, the air staying inside the case can be reduced and the battery and electric device can be cooled more efficiently.

(5) The power supply device according to (4), further including:
an intake side covering portion (upper surface covering material 61) which is arranged inside the case and covers a surface of the battery on the intake port side;
an exhaust side covering portion (lower surface covering material 62) which is arranged inside the case and covers a side opposite to the intake side covering portion in a state of interposing the battery; and
a fan (fan 63) which is connected to the exhaust side covering portion inside the case, takes in air which is taken in from the intake port and cools the battery, and discharges the air to a side (lower side) of the exhaust side covering portion where the battery is not arranged, where
the electric device is arranged side by side on one side (right side) of the battery in the longitudinal direction and the fan is arranged on an end portion on the other side (left side) of the battery.

According to (5), since the electric devices are arranged side by side on one side of the battery and the fan is arranged on the end portion on the other side of the battery, the air which discharged from the fan after cooling the battery and being heated is cooled while flowing in the vehicle width direction on the side of the exhaust side covering portion where the battery is not arranged. As a result, the cooled air can be supplied to the electric device, so that the electric device can be cooled more effectively.

(6) The power supply device according to (5), where
the intake side covering portion has an intake portion (intake portion 61a) which takes in air from the intake port to the battery, and
the intake portion is located on one end side (right end side) of the battery in the longitudinal direction and the fan is located on the other end side (left end side) of the battery.

According to (6), in the longitudinal direction, the intake portion is arranged on one end side of the battery and the fan is arranged on the other end side of the battery. Therefore, the air taken in from the intake portion flows from the intake portion to the fan, so that it flows from the intake side covering portion to the exhaust side covering portion and also flows from one end side to the other end side of the battery in the longitudinal direction. As a result, the air taken in from the intake portion can be flowed to the entire battery, so that the entire battery can be cooled uniformly.

The invention claimed is:

1. A power supply device comprising:
a battery;
an electric device arranged side by side with the battery;
a case which accommodates the battery and the electric device and has a case opening; and
a cover which covers the case opening, wherein:
a cable connected to another electric device arranged outside the case is connected to the electric device;
the cover is provided with a first exhaust port and a second exhaust port separated from each other;
a first exhaust member having a first exhaust passage through which air discharged from the first exhaust port flows is connected to the first exhaust port;
a second exhaust member having a second exhaust passage through which air discharged from the second exhaust port flows is connected to the second exhaust port;
the first exhaust port is provided so as to overlap at least a part of the electric device when viewed from an opening direction of the first exhaust port and has a larger opening area than the second exhaust port;

a minimum cross-sectional area of the first exhaust passage is smaller than a minimum cross-sectional area of the second exhaust passage;

the cover is provided with an intake port for taking in air inside the case, and the first exhaust port is formed on one side of the intake port in a longitudinal direction of the case and the second exhaust port is formed on the other side of the intake port.

2. The power supply device according to claim 1, wherein the cable is inserted into the case through the first exhaust port and connected to the electric device.

3. The power supply device according to claim 1, wherein:

the electric device has a fastening portion to which a terminal portion of the cable is fastened; and the fastening portion is provided at a position inside the first exhaust port when viewed from the opening direction of the first exhaust port.

4. The power supply device according to claim 1, further comprising:

an intake side covering portion which is arranged inside the case and covers a surface of the battery on the intake port side;

an exhaust side covering portion which is arranged inside the case and covers a side opposite to the intake side covering portion in a state of interposing the battery; and a fan which is connected to the exhaust side covering portion inside the case, takes in air which is taken in from the intake port and cools the battery, and discharges the air to a side of the exhaust side covering portion where the battery is not arranged, wherein the electric device is arranged side by side on one side of the battery in the longitudinal direction and the fan is arranged on an end portion on the other side of the battery.

5. The power supply device according to claim 4, wherein:

the intake side covering portion has an intake portion which takes in air from the intake port to the battery; and the intake portion is located on one end side of the battery in the longitudinal direction and the fan is located on the other end side of the battery.

* * * * *